(12) United States Patent
Pfautz et al.

(10) Patent No.: US 7,626,831 B2
(45) Date of Patent: Dec. 1, 2009

(54) CIRCUIT BOARD RETENTION SYSTEM

(75) Inventors: Douglas Sebastian Pfautz, Landisville, PA (US); Michael Steven Stanard, Riverside, IL (US)

(73) Assignee: Tyco Electronics Corporation, Middletown, PA (US)

( * ) Notice: Subject to any disclaimer, the term of this patent is extended or adjusted under 35 U.S.C. 154(b) by 85 days.

(21) Appl. No.: 10/970,228

(22) Filed: Oct. 21, 2004

(65) Prior Publication Data

US 2006/0087825 A1 Apr. 27, 2006

(51) Int. Cl.
 *H05K 1/11* (2006.01)
(52) U.S. Cl. ...................................... 361/803
(58) Field of Classification Search ................. 361/742, 361/758, 770, 804, 803
 See application file for complete search history.

(56) References Cited

U.S. PATENT DOCUMENTS

| | | | | |
|---|---|---|---|---|
| 4,915,607 A | * | 4/1990 | Medders et al. ............. | 425/116 |
| 5,027,505 A | * | 7/1991 | Nakamura et al. ............ | 29/832 |
| 5,252,784 A | * | 10/1993 | Asai et al. .................... | 174/267 |
| 5,270,641 A | * | 12/1993 | Van Loan et al. ............ | 324/757 |
| 5,530,204 A | * | 6/1996 | Kondo et al. ................. | 174/553 |
| 5,603,103 A | * | 2/1997 | Halttunen et al. ........ | 455/575.1 |
| 5,825,633 A | * | 10/1998 | Bujalski et al. ............. | 361/804 |
| 5,933,343 A | * | 8/1999 | Lu et al. ...................... | 363/144 |
| 6,175,243 B1 | * | 1/2001 | Kocher et al. ............... | 324/761 |
| 6,781,055 B2 | * | 8/2004 | Chen .......................... | 174/535 |
| 6,923,691 B2 | * | 8/2005 | Ireland ........................ | 439/876 |
| 6,956,746 B2 | * | 10/2005 | Barsun et al. ............... | 361/785 |
| 7,447,045 B2 | * | 11/2008 | Ikeya et al. ................. | 361/807 |
| 2006/0215374 A1 | * | 9/2006 | Chang ........................ | 361/742 |

\* cited by examiner

*Primary Examiner*—Dean A. Reichard
*Assistant Examiner*—Abiy Getachew

(57) ABSTRACT

A retaining member for a circuit board array is provided. The retaining member includes an elongated support post having a first end and an opposite second end. A protrusion extends from the first end. The protrusion is configured to be received in a slot having side walls in a circuit board array. The support post is movable to move the protrusion within the slot from a first position wherein the protrusion is disengaged from the side walls of the slot to a second position wherein the protrusion engages the side walls of the slot to retain the circuit board array.

20 Claims, 3 Drawing Sheets

CIRCUIT BOARD RETENTION SYSTEM

BACKGROUND OF THE INVENTION

The invention relates generally to circuit boards and, more particularly, to systems for retaining circuit boards.

Many different electronic devices are in common use today. Typically an electronic device includes a circuit board. Generally, unless a circuit board has a peculiar size or shape, it is cost effective to fabricate the circuit board in groups or arrays of identical circuit boards. The arrays include pre-routed slots between the circuit boards with tabs of circuit board material holding the boards together. It is common to populate the circuit boards with electrical components while the boards are joined together in the array, and the circuit boards are then separated from the array by a machine that cuts the tabs joining the circuit boards.

During the population and separation of the circuit boards, the array must be held or restrained from moving. The populated boards must also be supported after separation from the array to prevent damage to the circuit board or the components. If there are no holes or other retaining features provided in the circuit boards, nest pins are placed in the pre-routed slots surrounding each circuit board to prevent movement of the circuit boards. However, there is no standard width for the pre-routed slots, and the slots can vary in width from one circuit board array to another.

A universal fixture which may be used to process different circuit board arrays is desired. Conventional universal fixtures require different diameter nest pins for circuit board arrays that have different pre-routed slot widths. The need for different diameter nest pins and changing the nest pins for different circuit board arrays increases manufacturing time and costs for manufacturing circuit boards.

BRIEF DESCRIPTION OF THE INVENTION

In one aspect, a retaining member for a circuit board array is provided. The retaining member includes an elongated support post having a first end and an opposite second end. A protrusion extends from the first end. The protrusion is configured to be received in a slot having side walls in a circuit board array. The support post is movable to move the protrusion within the slot from a first position wherein the protrusion is disengaged from the side walls of the slot to a second position wherein the protrusion engages the side walls of the slot to retain the circuit board array.

In another aspect, a system for holding a circuit board array is provided that includes a base plate comprising a planar support surface and a support post selectively positionable on the base plate to support a circuit board array. The support post includes a body having a first end and an opposite second end. A protrusion extends from the first end. The protrusion is configured to be received in a slot having side walls in the circuit board array. The support post is movable to move the protrusion within the slot from a first position wherein the protrusion is disengaged from the side walls of the slot to a second position wherein the protrusion engages the side walls of the slot to retain the circuit board array.

In another aspect, a retaining member for a circuit board array is provided that includes a support post including a supporting end configured to engage opposing side walls of a slot separating individual circuit boards in a circuit board array. The slot including a width between the opposing side walls that is variable from a first slot width in a first circuit board array to a second slot width in a second circuit board array that is greater than the first slot width.

DETAILED DESCRIPTION OF THE INVENTION

Figure 1:
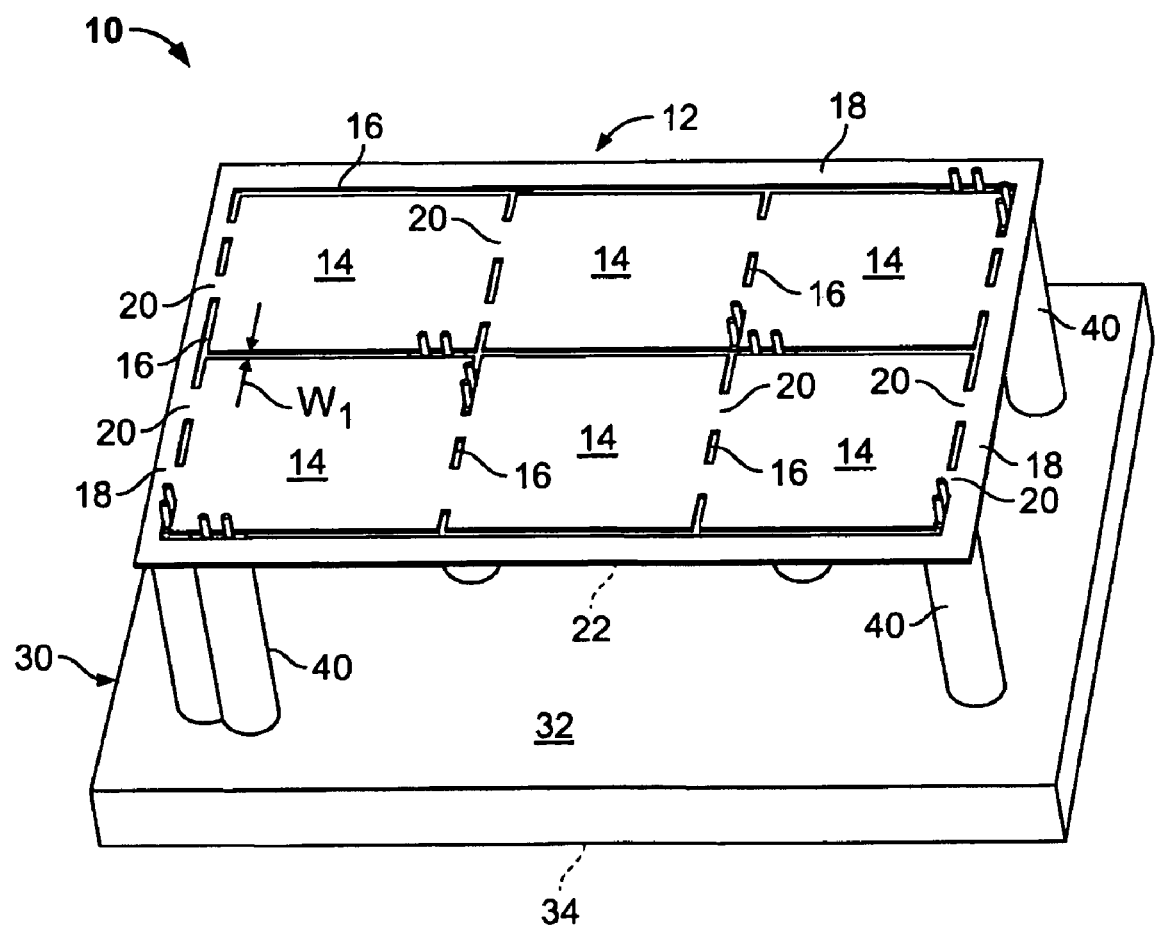
FIG. 1 is perspective view of a circuit board retention system formed in accordance with an exemplary embodiment of the present invention.

FIG. 1 illustrates an exemplary system 10 for retaining a circuit board array 12. While the invention will be described with respect to the circuit board array 12 which includes six individual circuit boards 14, it is to be understood that the benefits described herein can accrue to a single circuit board and to circuit board arrays of more or less than six individual circuit boards. The term circuit board array, as used herein, shall refer to one or more circuit boards joined together as a unit. The following description is for illustrative purposes only and is but one potential application of the inventive concepts herein.

The circuit board array 12, as shown in FIG. 1, includes a plurality of pre-routed slots 16 that separate the individual circuit boards 14 from one another. The slots 16 are elongated and have a slot width $W_1$ between substantially parallel opposite side walls. However, in alternative embodiments, the side walls of the slots 16 may not be parallel with respect to each other. Moreover, the slot width $W_1$ may vary from one circuit board array to another. The circuit board array 12 may also include a scrap edge 18 that forms a border around the circuit board array 12. When the scrap edge 18 is present, additional pre-routed slots 16 are provided to separate the individual circuit boards 14 from the scrap edge 18. The individual circuit boards 14 in the circuit board array 12 are held together by a plurality of tabs 20 that join the individual circuit boards 14 to one another and also to the scrap edge 18 when the scrap edge 18 is present.

The circuit board retention system 10 includes a base plate 30 that has a planar upper surface 32 and an opposite lower surface 34. A lower surface 22 of the circuit board array 12 rests on a plurality of support posts 40 that support the circuit board array 12 above the upper surface 32 of the base plate 30. In an exemplary embodiment, the base plate 30 and support posts 40 are fabricated from conductive materials to provide electrical grounding for components (not shown) that are to be mounted on the circuit boards 14. Alternatively, the support posts 40 may be fabricated from a non-conductive material, provided that separate grounding elements (not shown) are used to provide an electrical ground for each circuit board 14. In an exemplary embodiment, the upper surface 32 includes a ferrous or other magnetically sensitive material.

Figure 2:
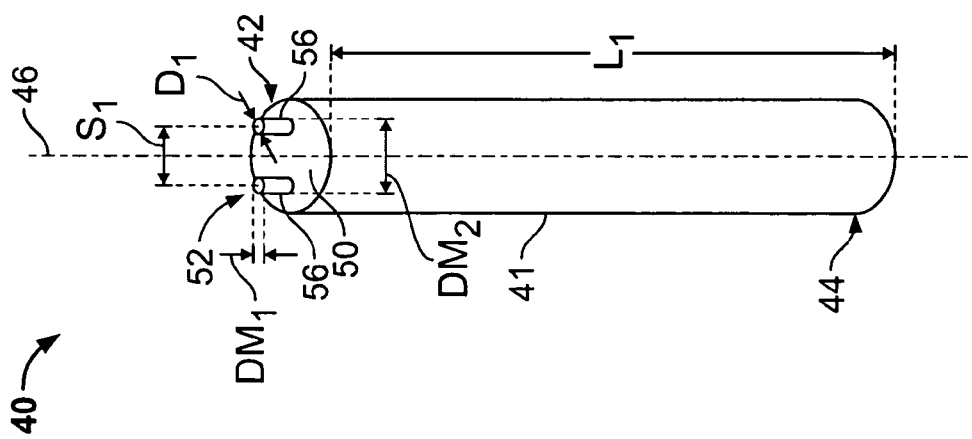
FIG. 2 is a perspective view of an exemplary support post suitable for use with the circuit board retention system shown in FIG. 1.

FIG. 2 is a perspective view of an exemplary support post 40 suitable for use with the circuit board retention system 10 shown in FIG. 1. The support post 40 includes an elongated body 41 that has a first end 42 and an opposite second end 44. The body 41 includes a longitudinal axis 46. The first end 42 of the support post 40 includes a support surface 50 upon which the lower surface 22 (FIG. 1) of the individual circuit boards 14 rests when the support posts 40 are positioned on the base plate 30 to support the circuit board array 12 (FIG. 1). The first end 42 also includes a protrusion 52 that extends longitudinally from the support surface 50. The protrusion 52 defines a first dimension $DM_1$ that is less than the slot width $W_1$ to allow insertion of the protrusion into the slot 16 and a second dimension $DM_2$ that is greater than the slot width $W_1$ to enable the protrusion to span the slot width $W_1$ to engage opposite side walls of the slot 16. The support post 40 has a length $L_1$ between the first and second ends 42 and 44 that is sized to provide a clearance between the lower surface 22 (FIG. 1) of the circuit board array 12 and the upper surface 32 of the base plate 30 that is sufficient for electrical components (not shown) that are to be mounted on the underside of the individual circuit boards 14.

In one embodiment, the protrusion 52 comprises a pair of nest pins 56 that extend longitudinally from the support surface 50. The nest pins 56 are displaced from one another a distance $S_1$ across the support surface 50. The nest pins 56 are sized so that an individual pin is easily received within the width $W_1$ (FIG. 1) of the slots 16 in the circuit board array 12. The distance $S_1$, which corresponds to a nest pin center spacing, is selected such that when the support post 40 is rotated, the pins will span the width $W_1$ of the slots 16 to engage opposite side walls 60 and 62 (see FIG. 3) of the slots 16 to retain and stabilize the circuit board array 12.

In one embodiment, the nest pins 56 are cylindrical having a diameter $D_1$ of about one millimeter and the center spacing $S_1$ is about six millimeters. In this configuration, the first dimension $DM_1$ corresponds to the pin diameter $D_1$, and the second dimension $DM_2$ corresponds to the pin center spacing $S_1$ plus one pin diameter $D_1$. In alternative embodiments, the nest pins 56 may be other shapes, such as, square, oval, or other multi-sided shapes, as well as larger or smaller in size. In other embodiments, the support posts 40 may be fitted with more than two nest pins 56 that are linearly arranged across the first end 42 of the support post 40.

The second end 44 of the support post 40 engages the upper surface 32 of the base plate 30. The second end 44 is configured to be coupled to the base plate 30 to support the circuit board array 12. In one embodiment, the second end 44 of the support post 40 is magnetically coupled to the base plate 30. In another embodiment, the upper surface 32 of the base plate 30 may include an array of threaded holes and the support post second end 44 may include a mounting extension for use with additional mounting hardware hereinafter described.

Figure 3:
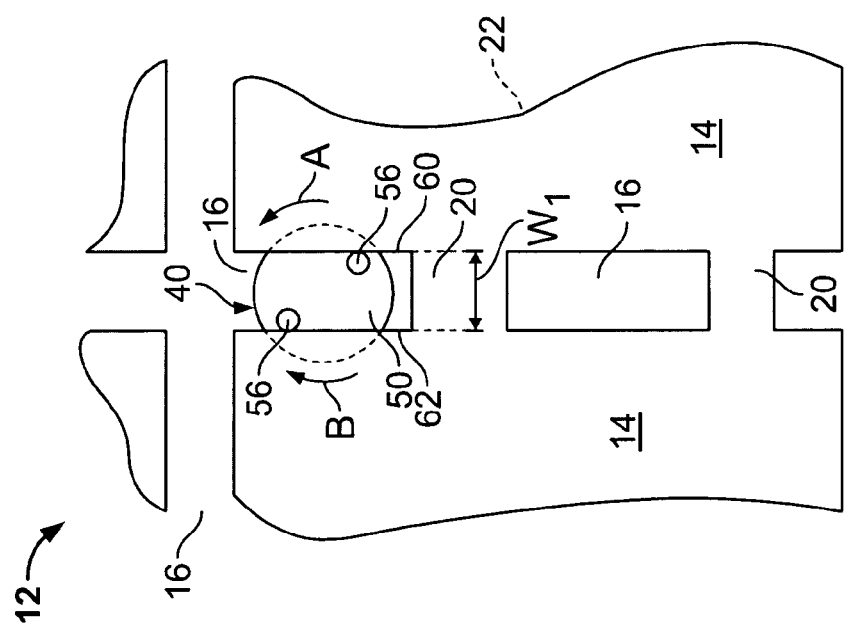
FIG. 3 is a top view of the support post shown in FIG. 2 positioned to support a circuit board array.

FIG. 3 illustrates the operation of the support post 40 to retain the circuit board array 12. The support post 40 is positioned underneath the circuit board array 12 with the nest pins 56 received in one of the slots 16 in a first position wherein the protrusion or nest pins 56 are disengaged from the side walls 60 and 62 of the slot 16. The support post 40 is then rotated either counterclockwise in the direction of either arrow A or clockwise in the direction of arrow B until the nest pins 56 are moved to a second position wherein the nest pins 56 engage the side walls 60 and 62 of the slot 16 to retain and stabilize the circuit board array 12 with lower surface 22 of the individual circuit boards resting on the support surface 50. When the nest pins 56 are positioned within the slot 16, the support post 40 has a range of rotation between two engagement or stabilizing positions. The first stabilizing position is as shown in FIG. 3 wherein the support post 40 is rotated counterclockwise until the nest pins 56 engage side walls 60 and 62 of the slot 16. The second stabilizing position is reached when the support post 40 is rotated clockwise until, again, the nest pins 56 engage the walls 60 and 62 of the slot 16. The pins 56 may be rotated to varying degrees depending on the width $W_1$ of the slot 16 such that a wider slot will entail a greater degree of rotation than a narrower slot. Typically, the support posts 40 are manually positioned on the base plate 30 and manually rotated to one of the stabilizing positions. However, it is also contemplated that the support post may be automatically or mechanically positioned and rotated. Slots of different widths up to a maximum width, corresponding to the spacing $S_1$ plus one diameter $D_1$ of the nest pins, may therefore be universally accommodated with the support posts 40 without having to change the posts for different boards. Thus the individual circuit boards 14 as well as the circuit board array 12 are supported and stabilized so that operations may be performed on the circuit boards 14 or so that the tabs 20 joining the individual circuit boards 14 and the scrap edge 18 (FIG. 1) can be removed to separate the individual circuit boards 14 from the array 12.

Typically, the individual circuit boards 14 are populated, that is, electronic components that will be used in the applications for which the circuit boards 14 are designed, are mounted on the individual circuit boards 14 while they are retained in the circuit board retention system 10. When the populating of the individual circuit boards 14 is completed, the individual circuit boards 14 are separated from the circuit board array 12 by cutting the tabs 20 that join the individual circuit boards 14 to the circuit board array 12. Once separated, the supporting surface 50 and the nest pins 56 of the support posts 40 hold the individual circuit boards 14. In this manner, damage to the components installed on the individual circuit boards 14 is prevented.

Figure 4:
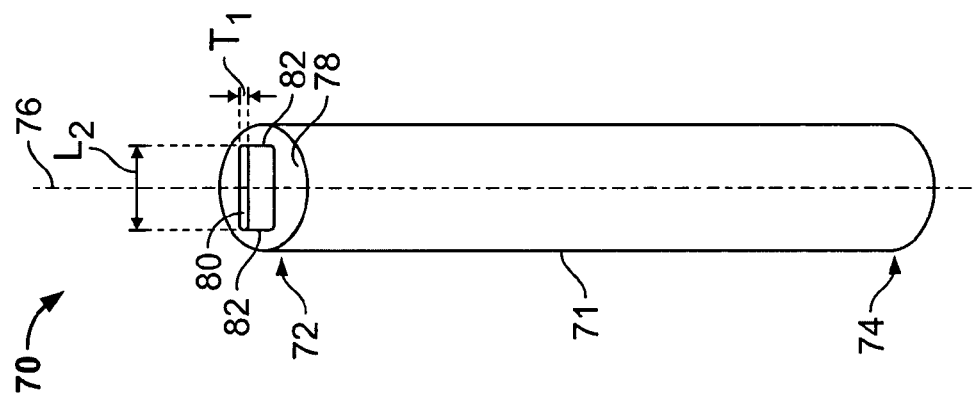
FIG. 4 is a perspective view of an alternative embodiment of a support post suitable for use with the circuit board retention system shown in FIG. 1.

FIG. 4 is a perspective view of an alternative embodiment of a support post 70 that is also suitable for use with the circuit board retention system 10 shown in FIG. 1. The support post 70 includes an elongated body 71 that has a first end 72 and a second end 74 opposite the first end 72. A longitudinal axis 76 extends through the body 71. The first end 72 includes a support surface 78 and a tongue 80 that extends longitudinally from the support surface 78. The tongue 80 is substantially rectangular in cross section. In one embodiment, the tongue 80 has radiused ends 82. Alternatively, however, the ends 82 may be squared. The tongue 80 has a first dimension corresponding to a thickness $T_1$ between substantially parallel sides and a second dimension corresponding to a length $L_2$. The thickness $T_1$ is sized to allow insertion of the tongue 80 in the slot 16 (FIG. 1). The length $L_2$ is sized such that when the support post 70 is positioned on the base plate 30 with the tongue 80 received in a slot 16 in the circuit board array 12, the support post 70 can be rotated so that the ends of the tongue 80 engage opposite side walls 60 and 62 (see FIG. 3) of the slot 16 in the circuit board array 12 to retain and stabilize the circuit board array 12. The second end 74 of the support post 70 is configured to be coupled to the upper surface 32 of the base plate 30. Circuit boards 14 or circuit board arrays 12 may therefore be secured for installation of electrical components and separation of the circuit boards 14 from the array 12.

Figure 5:
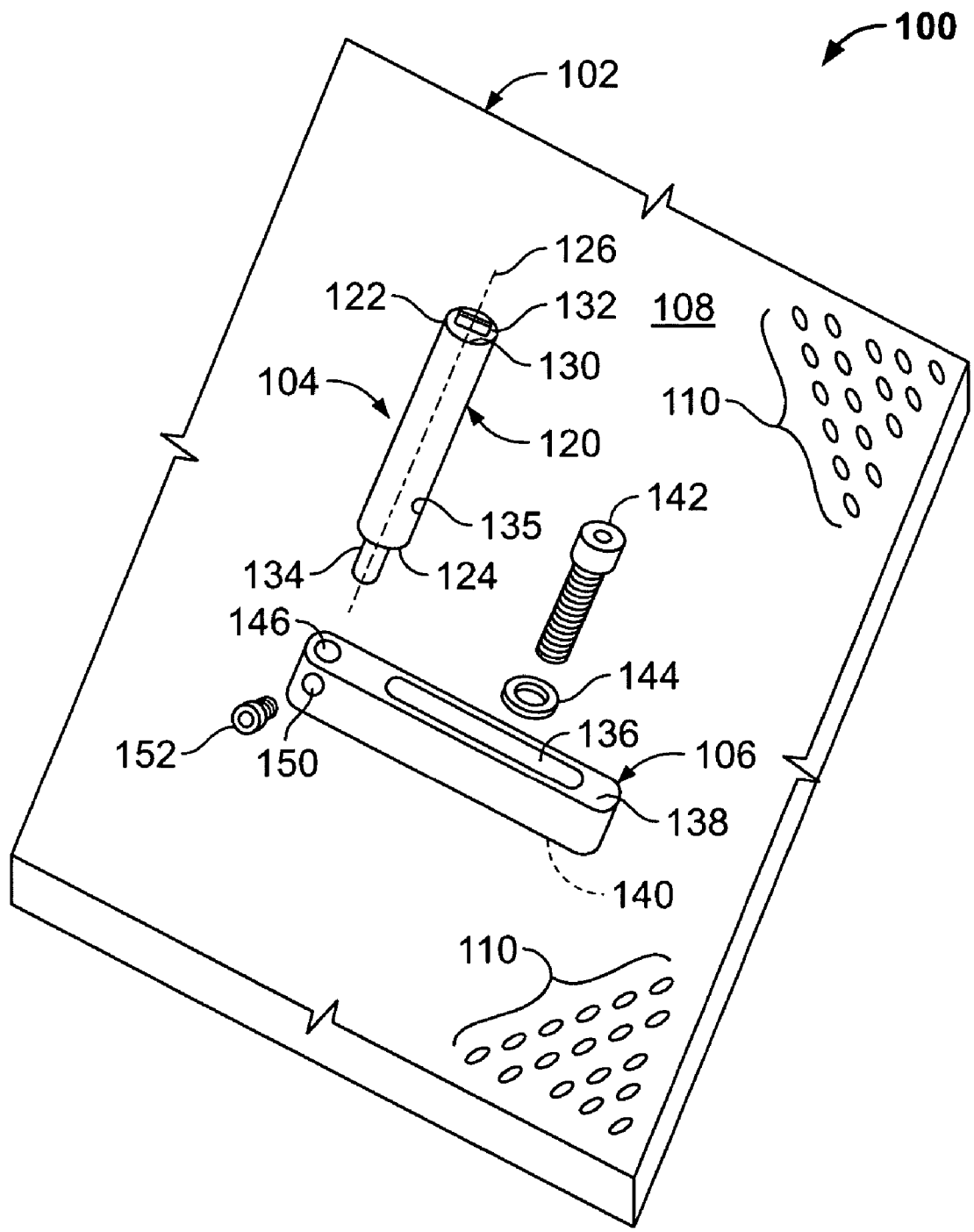
FIG. 5 is perspective view of a circuit board retention system formed in accordance with an alternative embodiment of the invention.

FIG. 5 is a perspective view of a circuit board retention system 100 formed in accordance with an alternative embodiment of the present invention. The system 100 includes a base plate 102, a support post 104, and a swivel base 106 that is used to couple the support post 104 to the base plate 102. The base plate 102 includes a substantially planar upper surface 108 that includes a plurality of threaded holes 110.

The support post 104 includes an elongated body 120 that has a first end 122 and an opposite second end 124. The body 120 includes a longitudinal axis 126. The first end 122 of the support post 104 includes a support surface 130 upon which the lower surface 22 (FIG. 1) of the individual circuit boards 14 rests when the support posts 104 are positioned on the base plate 102 to support the circuit board array 12 (FIG. 1). The first end 122 also includes a protrusion 132 that extends longitudinally from the support surface 130. In one embodiment, the protrusion 132 may be in the form of a tongue as shown, however, in other embodiments, the protrusion may be in the form of two or more pins linearly arranged across the support surface 130 as in the support post 40 shown in FIG. 3. The body 120 includes a cylindrical mounting extension 134 at the second end 124. The mounting extension 134 has a cross section that is smaller than a cross section of the body 120 such that a shoulder 135 is formed on the body 120.

The swivel base 106 is provided to couple the support post 104 to the base plate 102. The swivel base 106 includes a slot 136 extending therethrough from an upper surface 138 to a lower surface 140. The slot 136 is sized to receive a threaded fastener 142 to attach the swivel base 106 to the base plate 102. The fastener 142 may be used with a washer 144. The swivel base 106 includes an aperture 146 that is sized to receive the mounting extension 134 of the support post 104. A threaded hole 150 is positioned and aligned to intersect the aperture 146. The threaded hole 150 receives a set screw 152 that frictionally engages the mounting extension 134 of the support post 104 to hold the support post 104 in a fixed position when the support post 104 is mounted on the swivel base 106.

The holes 110 in the base plate 102 are each threaded and sized to receive the fastener 142 to attach the swivel base 106 to the base plate 102. The swivel base 106 is selectively mounted at one of the holes 110 in the base plate 102 and is variably positioned using the slot 136 to locate the support post 104 at a desired position to support and retain the circuit board array 12 (FIG. 1) when the support post 104 is mounted on the swivel base 106. The support post 104 is mounted on the swivel base 106 by inserting the mounting extension 134 into the aperture 146 with the shoulder 135 of the support post 104 engaging the upper surface 138 of the swivel base 106. The support post 104 can be rotationally adjusted by loosening the set screw 152. In use, the tongue 132 on the support post 104 is inserted in a slot 16 in the circuit board array 12 (FIG. 1) and the support post 104 rotated until the tongue 132 engages the side walls 60 and 62 (FIG. 3) of the slot 16. The set screw 152 is then tightened to retain the circuit board array 12.

The embodiments thus described provide a universal circuit board retention system that can economically be used to support and retain an individual circuit board or a circuit board array wherein individual circuit boards are separated by slots and wherein the slot widths vary from one array to another. The circuit board retention system includes nest pins or suitable protrusions that are rotatable to engage opposite side walls of the slots in the circuit board array. Circuit boards may therefore be manufactured at lower cost with a single set of nest pins.

While the invention has been described in terms of various specific embodiments, those skilled in the art will recognize that the invention can be practiced with modification within the spirit and scope of the claims.

What is claimed is:

1. A retaining member for a circuit board array comprising:
a support post having a first end for supporting the circuit board array and an opposite second end; and
a protrusion extending from said first end, said protrusion receivable in a slot having side walls in the circuit board array, said support post rotatable to move said protrusion within the slot from a first position wherein said protrusion does not contact the side walls of the slot to a second position wherein said protrusion contacts the side walls of the slot to retain the circuit board array, wherein the protrusion is configured to be received in a slot having side walls in a circuit board array, the support post is movable to move the protrusion within the slot from a first position wherein the protrusion is disengaged from the side walls of the slot to a second position wherein the protrusion engages the side walls of the slot to retain the circuit board array.

2. The retaining member of claim 1, wherein said protrusion comprises at least two pins protruding from said first end of said support post in a direction parallel to a longitudinal axis of said support post, said pins linearly aligned and displaced from one another along a direction transverse to said longitudinal axis.

3. The retaining member of claim 1, wherein said protrusion comprises a tongue.

4. The retaining member of claim 1, wherein said support post includes a support surface on said first end.

5. The retaining member of claim 1, wherein said support post is configured to elevate the circuit board from a base plate.

6. A system for holding a circuit board array, said system comprising:
a base plate comprising a planar upper surface; and
a support post selectively positionable on said base plate, said support post comprising:
a body having a first end for supporting the circuit board array and an opposite second end; and
a protrusion extending from said first end, said protrusion receivable in a slot having side walls in the circuit board array, said support post rotatable to move said protrusion within the slot from a first position wherein said protrusion does not contact the side walls of the slot to a second position wherein said protrusion contacts the side walls of the slot to retain the circuit board array, wherein the support post is movable to move the protrusion within the slot from a first position wherein the protrusion is disengaged from the side walls of the slot to a second position wherein the protrusion engages the side walls of the slot to retain the circuit board array.

7. The system of claim 6, wherein said protrusion comprises at least two pins protruding from said first end of said support post in a direction parallel to a longitudinal axis of said support post, said pins linearly aligned and displaced from one another along a direction transverse to said longitudinal axis.

8. The system of claim 6, wherein said protrusion comprises a tongue.

9. The system of claim 6, wherein said support post includes a support surface on said first end.

10. The system of claim 6, wherein said planar upper surface is formed from a magnetically sensitive material and said second end of said elongated body is magnetically coupled to said base plate.

11. The system of claim 6 further comprising a swivel base mounted on said base plate, said elongated body including a mounting extension at said second end to couple said support post to said swivel base.

12. The system of claim 6 wherein said base plate and said support post are fabricated from a conductive material.

13. The system of claim 6 further comprising a grounding element to provide electrical grounding for circuit boards in the circuit board array.

14. A retaining member for a circuit board array comprising:

a support post including a circuit board supporting end comprising a protrusion receivable between the opposing side walls of a slot separating individual circuit boards in a circuit board array, said protrusion having a first dimension and a second dimension greater than the first dimension, said support post rotatable to move said protrusion within the slot to a first position wherein said protrusion simultaneously contacts the opposing side walls of slots having a width within a range from the first protrusion dimension to the second protrusion dimension, said support post rotatable to move said protrusion within the slot to a second position wherein said protrusion does not contact the opposing side walls of the slots.

15. The retaining member of claim 14, wherein said supporting end comprises a supporting surface and said protrusion extends from said supporting surface.

16. The retaining member of claim 14, wherein said protrusion comprises a pair of nest pins displaced across said supporting end, said nest pins defining said first dimension and said second dimension and wherein said nest pins simultaneously engage opposing side walls of the slot when said support post is rotated relative to the circuit board array.

17. The retaining member of claim 14, wherein said support post includes a ground path for the circuit board array.

18. The retaining member of claim 1, wherein said protrusion extends from said first end of said support post along a longitudinal axis of said support post and has a dimension in a direction transverse to said longitudinal axis, said protrusion shaped along said dimension such that said protrusion does not engage the side walls of the slot when the protrusion is in said first position and does engage the side walls of the slot when the protrusion is rotated into said second position.

19. The system of claim 6, wherein said protrusion of said support post extends from said first end of said body along a longitudinal axis of said support post and has a dimension in a direction transverse to said longitudinal axis, said protrusion shaped along said dimension such that said protrusion does not engage the side walls of the slot when the protrusion is in said first position and does engage the side walls of the slot when the protrusion is rotated into said second position.

20. The retaining member of claim 14, wherein said protrusion comprises a tongue having a planar body that extends from said first end of said support post in a direction parallel to a longitudinal axis of said support post and along the second dimension of said protrusion.

* * * * *